United States Patent
Igarashi et al.

(10) Patent No.: US 10,076,789 B2
(45) Date of Patent: Sep. 18, 2018

(54) SURFACE-COATED TITANIUM CARBONITRIDE-BASED CERMET CUTTING TOOL HAVING EXCELLENT CHIPPING RESISTANCE

(71) Applicant: MITSUBISHI MATERIALS CORPORATION, Tokyo (JP)

(72) Inventors: Makoto Igarashi, Naka (JP); Akihiro Murakami, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 208 days.

(21) Appl. No.: 15/121,305

(22) PCT Filed: Feb. 25, 2015

(86) PCT No.: PCT/JP2015/055482
§ 371 (c)(1),
(2) Date: Aug. 24, 2016

(87) PCT Pub. No.: WO2015/129771
PCT Pub. Date: Sep. 3, 2015

(65) Prior Publication Data
US 2017/0008093 A1 Jan. 12, 2017

(30) Foreign Application Priority Data
Feb. 26, 2014 (JP) .................. 2014-035096
Feb. 20, 2015 (JP) .................. 2015-031363

(51) Int. Cl.
B32B 27/14 (2006.01)
B23B 27/14 (2006.01)
(Continued)

(52) U.S. Cl.
CPC ............ *B23B 27/148* (2013.01); *C22C 29/04* (2013.01); *C23C 16/0281* (2013.01);
(Continued)

(58) Field of Classification Search
USPC ........... 51/307, 309; 428/336, 697, 698, 699
See application file for complete search history.

(56) References Cited

U.S. PATENT DOCUMENTS 5,296,016 A * 3/1994 Yoshimura ............ C23C 28/044
75/246
6,214,247 B1 4/2001 Leverenz et al.
(Continued)

FOREIGN PATENT DOCUMENTS

CN 103008696 A 4/2013
CN 103128325 A 6/2013
(Continued)

OTHER PUBLICATIONS

European Search Report dated Sep. 7, 2017 for the corresponding European Patent Application No. 15754689.6.
(Continued)

*Primary Examiner* — Archene Turner
(74) *Attorney, Agent, or Firm* — Leason Ellis LLP

(57) ABSTRACT

A surface-coated titanium carbonitride-based cermet cutting tool is a surface-coated TiCN-based cermet cutting tool in which a Ti compound layer that is a hard coating layer is deposited as a first layer on the surface of a TiCN-based cermet body containing W and Mo, and a Mo-enriched layer having an average thickness of 0.5 to 10 nm is formed at an interface between a TiCN phase of the body and the hard coating layer.

6 Claims, 1 Drawing Sheet

(51) Int. Cl.
*C23C 16/30* (2006.01)
*C23C 16/02* (2006.01)
*C23C 16/34* (2006.01)
*C23C 16/36* (2006.01)
*C23C 28/00* (2006.01)
*C23C 16/32* (2006.01)
*C23C 16/44* (2006.01)
*C22C 29/04* (2006.01)
*B22F 5/00* (2006.01)

(52) U.S. Cl.
CPC .............. *C23C 16/30* (2013.01); *C23C 16/32* (2013.01); *C23C 16/34* (2013.01); *C23C 16/36* (2013.01); *C23C 16/44* (2013.01); *C23C 28/321* (2013.01); *C23C 28/34* (2013.01); *C23C 28/341* (2013.01); *C23C 28/347* (2013.01); *C23C 28/3455* (2013.01); *B22F 2005/001* (2013.01); *B23B 2222/16* (2013.01); *B23B 2224/28* (2013.01); *B23B 2224/32* (2013.01); *B23B 2224/36* (2013.01); *B23B 2228/04* (2013.01); *B23B 2228/105* (2013.01)

(56) References Cited

U.S. PATENT DOCUMENTS

| | | | |
|---|---|---|---|
| 6,228,484 B1 * | 5/2001 | Willert-Porada | B22F 3/105 428/336 |
| 2005/0164042 A1 | 7/2005 | Hayashi et al. | |
| 2014/0287210 A1 | 9/2014 | Tomita et al. | |

FOREIGN PATENT DOCUMENTS

| | | | |
|---|---|---|---|
| JP | 55-158269 A | | 12/1980 |
| JP | 02-004972 | * | 1/1990 |
| JP | 03-226576 A | | 10/1991 |
| JP | 04-231467 A | | 8/1992 |
| JP | 04-289003 A | | 10/1992 |
| JP | 11-511078 A | | 9/1999 |
| JP | 2013-063504 A | | 4/2013 |
| WO | WO-97/04143 A | | 2/1997 |
| WO | WO-2013/031952 A | | 3/2013 |

OTHER PUBLICATIONS

Chen et al., "Fundamentals of liquid phase sintering for modern cermets and functionally graded cemented carbonitrides (FGCC)", *International Journal of Refractory Metals and Hard Materials*, May 9, 2000, pp. 307-322, vol. 18.

International Search Report dated Apr. 7, 2015 for the corresponding PCT Application No. PCT/JP2015/055482.

Office Action dated May 3, 2017 for the corresponding Chinese Patent Application No. 201580010453.5.

* cited by examiner

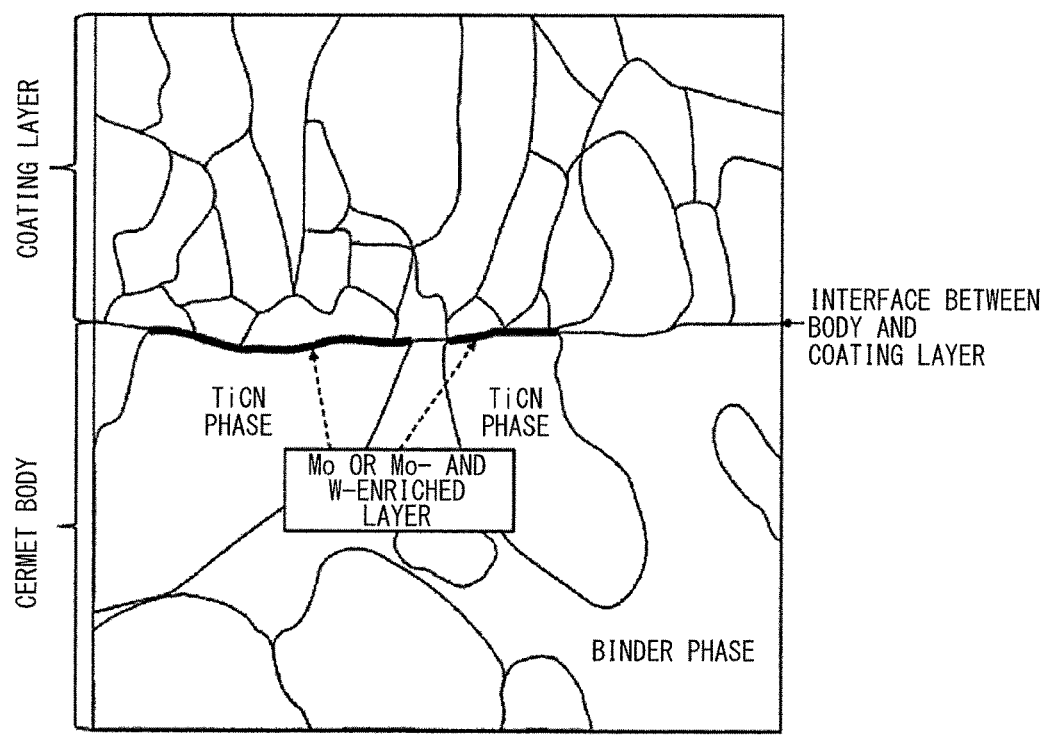

SURFACE-COATED TITANIUM CARBONITRIDE-BASED CERMET CUTTING TOOL HAVING EXCELLENT CHIPPING RESISTANCE

CROSS-REFERENCE TO RELATED PATENT APPLICATIONS

This application is a U.S. National Phase Application under 35 U.S.C. § 371 of International Patent Application No. PCT/JP2015/055482, filed Feb. 25, 2015, and claims the benefit of Japanese Patent Application No. 2014-035096, filed Feb. 26, 2014 and Japanese Patent Application No. 2015-031363, filed Feb. 20, 2015, all of which are incorporated by reference herein in their entireties. The International Application was published in Japanese on Sep. 3, 2015 as International Publication No. WO/2015/129771 under PCT Article 21(2).

FIELD OF THE INVENTION

The present invention relates to a surface-coated titanium carbonitride-based cermet cutting tool (hereinafter, referred to as coated tool) in which a cermet tool body and a hard coating layer have excellent adhesion strength, and as a result the hard coating layer exhibits excellent chipping resistance even during cutting work in which a high load is exerted on a cutting edge.

BACKGROUND OF THE INVENTION

Conventionally, generally, a coated tool produced by forming a hard coating layer, which is constituted by (a) as a lower layer and (b) as an upper layer on the surface of a body (hereinafter, referred to as a "cermet body") formed of a titanium carbonitride (hereinafter, referred to as TiCN)-based cermet is well known. (a) The lower layer is a Ti compound layer which includes two or more layers of a Ti carbide (hereinafter, referred to as TiC) layer, a Ti nitride (hereinafter, referred to as TiN) layer, a Ti carbonitride (hereinafter, referred to as TiCN) layer, a Ti oxycarbide (hereinafter, referred to as TiCO) layer, and a Ti oxycarbonitride (hereinafter, referred to as TiCNO) layer, each of which is formed through chemical vapor deposition, and has an average total layer thickness of 3 to 20 μm; and (b) the upper layer is an aluminum oxide (hereinafter, referred to as $Al_2O_3$) layer which is formed through chemical vapor deposition and has an average layer thickness of 1 to 25 μm.

Although the coated tool in the related art has relatively excellent wear resistance, abnormal wear such as chipping is likely to occur therein under cutting work conditions in which a high load is exerted on a cutting edge. Therefore, various proposals for the structure of the hard coating layer have been made.

For example, Patent Document 1 discloses a method of producing a coating cermet in which a titanium nitride layer is chemically deposited on the surface of a cermet including 70 to 95 wt % of a hard dispersed phase-forming component of one type or two or more types of carbides, nitrides, and carbonitrides of Ti, Zr, Hf, Ta, Nb, W, Mo, and Cr and 5 to 30 wt % of a binder phase-forming component of one or two or more of Co, Ni, and Al. In the method of producing a coating cermet, a method of producing a coating cermet by forming the titanium nitride layer through chemical vapor deposition on the surface of the cermet at a temperature of 700° C. to 900° C. using a mixed gas of titanium tetrachloride, ammonia, and hydrogen is proposed. It is thought that a coating cermet which has high wear resistance and can be used for a longer period of time than in the related art can be accordingly provided.

In addition, Patent Document 2 discloses a surface-coated titanium carbonitride-based cermet cutting tool produced by forming a hard coating layer including a plurality of layers formed of two or more of a Ti carbide, a Ti nitride, a Ti carbonitride, and an aluminum oxide on the surface of a titanium carbonitride-based cermet body containing 12 to 20 wt % of a binder phase-forming component primarily containing Co and Ni, using a chemical vapor deposition method or a physical vapor deposition method. Regarding the surface-coated titanium carbonitride-based cermet cutting tool, a configuration in which the surface portion of the body is formed as a binder phase layer having an average layer thickness of 0.5 to 1.5 μm and containing a binder phase constituent component, and the hard coating layer that comes into contact with the binder phase layer of the surface portion of the body is formed as a binder phase constituent component diffusion prevention layer having an average layer thickness of 0.5 to 5 μm and containing titanium nitride is proposed. It is thought that excellent toughness is accordingly exhibited.

In addition, Patent Document 3 discloses a cutting tool insert made of a carbonitride alloy containing Ti as a primary component and containing W and Co, which includes a wear-resistant layer formed by a chemical vapor deposition method of one layer or a plurality of layers formed of carbides, nitrides, oxides, or borides (excluding borides of the element B) of the elements Ti, Al, Zr, Hf, V, Nb, Ta, Cr, Mo, W, Si, or B, a combination thereof, or a solid solution thereof, and is coated to have a total coating thickness of 1 to 20 μm. Furthermore, Patent Document 3 proposes a cutting tool insert made of a carbonitride alloy containing Ti as a primary component and containing W and Co, in which the coating layer does not have cooling cracks, the wear-resistant layer formed of a single layer or a plurality of layers having the same crystal structure and having a thickness of greater than 1 μm by a chemical vapor deposition method has a compressive residual stress of 200 to 500 MPa at room temperature; the carbonitride alloy containing Ti as a primary component and containing W and Co is formed of C, N, Ti, W, and Co, the atomic fractions of the elements satisfy the relationships of $0.25 < N/(C+N) < 0.5$, $0.05 < W/(W+Ti) < 0.11$, and $0.09 < Co < 0.14$; Ti is partially substituted with Ta, Nb, V, Zr, Hf, and/or Mo, the amount of each element is less than 5 at %, and the total amount of the elements is less than 10 at %. In the above-described configuration, it is thought that the cutting tool insert made of a carbonitride alloy exhibits excellent toughness and wear resistance.

CITATION LIST

Patent Document

[Patent Document 1] Japanese Unexamined Patent Application, First Publication No. H3-226576
[Patent Document 2] Japanese Unexamined Patent Application, First Publication No. H4-289003
[Patent Document 3] Published Japanese Translation No. H11-511078 of the PCT International Publication

Technical Problem

In recent years, the performance of cutting apparatuses has been enhanced significantly, and there has been a strong demand for power saving and energy saving during cutting work and a further reduction in cost. In accordance with this, there is a trend toward a further increase in speed and efficiency during cutting work. Therefore, abnormal damage resistance such as chipping resistance, defect resistance, and peeling resistance is further required for a coated tool, and excellent wear resistance is required during long-term use.

However, in the coated tools described in Patent Documents 1 to 3, the adhesive strength between the cermet body and the hard coating layer is insufficient. Therefore, particularly in a case where the coated tool is used for high-speed intermittent cutting of cast iron or alloy steel during which a high impact is intermittently applied to a cutting edge, there is a problem in that a tool service life is reached relatively quickly due to the occurrence of chipping.

SUMMARY OF THE INVENTION

Solution to Problem

Therefore, in order to solve these problems and provide a coated tool which exhibits excellent chipping resistance even in a case of being provided for high-speed intermittent cutting work of cast iron, alloy steel, or the like and exhibits excellent wear resistance during long-term use, the inventors intensively studied a coated tool in which the surface of a cermet body is coated with a Ti compound layer through a chemical vapor deposition method and the state of the interface therebetween, and obtained the following knowledge.

It was found that in a surface-coated cutting tool in which a hard coating layer is provided on the surface of a cermet body formed of a titanium carbonitride-based cermet, by performing Ti etching on the surface of the cermet body, for example, using a thermal CVD method in which $TiCl_4$ is contained as a reaction gas component, before the hard coating layer including at least one layer of a Ti nitride, a Ti carbide, a Ti oxycarbide, and a Ti oxycarbonitride is formed, W and Mo, which are cermet constituent components, can be caused to be unevenly distributed on the surface of the cermet body.

Subsequently, it was found that when the hard coating layer including at least one layer of a Ti nitride, a Ti carbide, a Ti oxycarbide, and a Ti oxycarbonitride is formed through chemical vapor deposition to coat the cermet body in which W and Mo are unevenly distributed on the surface, chemical bonds between the cermet body and the hard coating layer become strong via W and Mo unevenly distributed at the interface therebetween. It was found that the hard coating layer formed on the cermet body has excellent adhesive strength to the cermet body via W and Mo unevenly distributed at the interface of the cermet body and excellent chipping resistance is exhibited when the hard coating layer is used for high-speed intermittent cutting work of cast iron, alloy steel, or the like in which a high load is exerted on a cutting edge.

The present invention has been made on the basis of the results of the study described above and provides a surface-coated titanium carbonitride-based cermet cutting tool having the following features.

(1) A surface-coated TiCN-based cermet cutting tool, including: a body made of a TiCN-based cermet containing a TiCN phase as a hard phase component and containing 1 to 10 at % of each of W and Mo; and a hard coating layer which is a first layer deposited on a surface of the body made of the TiCN-based cermet and is formed of any of a Ti carbide, a Ti nitride, a Ti carbonitride, a Ti oxycarbide, and a Ti oxycarbonitride, in which a Mo-enriched layer having an average thickness of 0.5 to 10 nm is formed at an interface between the TiCN phase of the body and the hard coating layer.

(2) The surface-coated TiCN-based cermet cutting tool described in (1), in which, in a case where the interface between the TiCN phase of the body and the hard coating layer is observed in a longitudinal section of the surface-coated TiCN-based cermet cutting tool, the Mo-enriched layer is formed at an interface having a length of 60% or more of that of the interface between the TiCN phase of the body and the hard coating layer.

(3) The surface-coated TiCN-based cermet cutting tool described in (1) or (2), in which, in addition to the Mo-enriched layer, a W-enriched layer having an average thickness of 0.5 to 10 nm is formed at the interface between the TiCN phase of the body and the hard coating layer.

(4) The surface-coated TiCN-based cermet cutting tool described in (3), in which, in a case where the interface between the TiCN phase of the body and the hard coating layer is observed in the longitudinal section of the surface-coated TiCN-based cermet cutting tool, the W-enriched layer is formed at an interface having a length of 60% or more of that of the interface between the TiCN phase of the body and the hard coating layer.

In addition, as described above, regarding the hard coating layer of the present invention, after the hard coating layer formed of any of a Ti carbide, a Ti nitride, a Ti carbonitride, a Ti oxycarbide, and a Ti oxycarbonitride is deposited as the first layer, deposition of a well-known hard coating layer such as an $Al_2O_3$ layer, a layer of a composite nitride or composite oxide of Ti and Al, and a layer of a composite nitride or composite oxide of Cr and Al thereon is not impeded. Furthermore, deposition of a Ti carbide, a Ti nitride, a Ti carbonitride, a Ti oxycarbide, and a Ti oxycarbonitride as the outermost surface layer is not impeded.

Advantageous Effects of Invention

The present invention relates to a surface-coated TiCN-based cermet cutting tool which includes a hard coating layer formed of any of a Ti carbide, Ti nitride, Ti carbonitride, Ti oxycarbide, and Ti oxycarbonitride as the first layer deposited on the surface of a body formed of the TiCN-based cermet. In the surface-coated TiCN-based cermet cutting tool of the present invention, predetermined amounts of Mo and W are contained as components of the TiCN-based cermet, and Ti etching is performed on the surface of the body formed of the TiCN-based cermet before the deposition of the first layer of the hard coating layer. During the Ti etching, when the first layer is deposited, a state in which the Mo-enriched layer and the W-enriched layer having predetermined thicknesses, predetermined amounts, and predetermined interface lengths are formed at the interface between the TiCN phase of the body and the hard coating layer is achieved. In addition, chemical bonds between the body formed of the TiCN-based cermet and the hard coating layer can be strengthened via W and Mo unevenly distributed at the interface, that is, the Mo-enriched layer and the W-enriched layer. Therefore, the surface-coated TiCN-based cermet cutting tool of the present invention has excellent adhesive strength between the hard coating layer coating the body and the body formed of the TiCN-based cermet and thus exhibits excellent chipping resistance and wear resistance during long-term use even in a case of being used for high-speed intermittent cutting work of cast iron, alloy steel, or the like in which a high load is exerted on a cutting edge.

BRIEF DESCRIPTION OF THE DRAWINGS

FIG. 1 is a schematic sectional view illustrating Mo or Mo- and W-enriched layers formed at an interface between a TiCN phase of a body formed of a TiCN-based cermet and a hard coating layer in a surface-coated TiCN-based cermet cutting tool of the present invention.

DETAILED DESCRIPTION OF THE INVENTION

Next, an embodiment of a hard coating layer of a surface-coated TiCN-based cermet cutting tool of the present invention will be described in more detail.

The surface-coated TiCN-based cermet cutting tool of this embodiment includes: a body made of a TiCN-based cermet containing a TiCN phase as a hard phase component and containing 1 to 10 at % of each of W and Mo; and a hard coating layer which is a first layer deposited on the surface of the body made of the TiCN-based cermet and is formed of any of a Ti carbide, a Ti nitride, a Ti carbonitride, a Ti oxycarbide, and a Ti oxycarbonitride, in which a Mo-enriched layer having an average thickness of 0.5 to 10 nm is formed at an interface between the TiCN phase of the body and the hard coating layer. Hereinafter, the body made of the TiCN-based cermet is sometimes called a cermet body.

W and Mo:

W and Mo as components contained in the TiCN-based cermet contribute to solid-solution strengthening of a binder phase and an improvement in the strength and hardness of the cermet body through the generation of a hard phase. However, when the amount thereof is less than 1 at %, this effect cannot be expected, and the Mo-enriched layer and a W-enriched layer cannot be formed at predetermined concentrations in predetermined amounts at the interface between the TiCN phase of the body and the hard coating layer.

On the other hand, when the amount of each of W and Mo in the TiCN-based cermet is more than 10 at %, a reduction in the strength of the cermet body is incurred due to precipitation of the carbide, the nitride, and the carbonitride. Therefore, the amount of W and Mo in the TiCN-based cermet is determined to be 1 to 10 at %. The amount of W and Mo in the TiCN-based cermet is preferably 2 at % to 8 at %, and more preferably 2 at % to 5 at %.

The amount of W and Mo in the TiCN-based cermet is determined by a mixing composition of raw materials (metallic powders) when the cermet body is produced.

Mo-Enriched Layer:

In this embodiment, in the cermet body, before the deposition of any of the Ti carbide, the Ti nitride, the Ti carbonitride, the Ti oxycarbide, and the Ti oxycarbonitride as the first layer, Ti etching, which will be described later, is performed on the surface of the cermet body to cause Mo to be unevenly distributed in the TiCN phase of the surface of the cermet body. In addition, by causing Mo to be unevenly distributed in the TiCN phase of the surface of the cermet body and forming the Mo-enriched layer, wettability of the cermet body and the hard coating layer is improved, and chemical bonds between the cermet body and the hard coating layer become strong. Therefore, the adhesive strength between the hard coating layer and the cermet body can be improved.

When the average thickness of the Mo-enriched layer formed at the interface between the TiCN phase of the cermet body and the hard coating layer is smaller than 0.5 nm, the improvement in the adhesion strength cannot be expected. When the average thickness thereof is greater than 10 nm, cracks propagate in the Mo-enriched layer and thus the adhesion strength is reduced. Therefore, the average thickness of the Mo-enriched layer is determined to be 0.5 to 10 nm. The average thickness of the Mo-enriched layer is preferably 2 nm to 8 nm, and more preferably 3 nm to 7 nm.

The Mo-enriched layer unevenly distributed on the TiCN phase of the surface of the cermet body is a region having a Mo content of 5 to 50 at % at the interface between the TiCN phase and the hard coating layer.

When the Mo content of the interface between the TiCN phase and the hard coating layer is less than 5 at %, the Mo-enriched layer slightly contributes to the improvement in the adhesion strength. When the Mo content is more than 50 at %, the interface has metallic properties and the effect of strengthening chemical bonds between the cermet body and the hard coating layer is degraded. Therefore, at the interface between the TiCN phase and the hard coating layer, a region which has a Mo content of 5 to 50 at % and satisfies the average thickness is determined as the Mo-enriched layer.

The Mo-enriched layer can be specified in the following method. Compositional mapping of a longitudinal section of the surface-coated TiCN-based cermet cutting tool is performed in a visual field at 10,000× using a transmission electron microscope (TEM) and an energy-dispersive X-ray analyzer, a TiCN phase in the cermet body is specified, a region including the interface between the TiCN phase and the hard coating layer is observed in a visual field at 500,000×, a line is drawn into a length of 50 nm to be perpendicular to the interface between the TiCN phase and the hard coating layer so as to intersect the interface between the TiCN phase and the hard coating layer at the center of the line segment, line analysis including the interface between the TiCN phase and the hard coating layer is performed by performing compositional analysis on the line at intervals of 0.5 nm, and a region having an (average) Mo content of 5 to 50 at % at five measurement points is specified. In addition, in the region having a Mo content of 5 to 50 at %, a portion having a thickness of 0.5 to 10 nm is determined as the Mo-enriched layer. Line analysis is performed on five TiCN phases, and the average value of the thicknesses of the five points is determined as the average thickness.

The TiCN phase in the cermet body is a phase formed of Ti, C, and N and does not contain Mo and W. That is, a TiCNMo composition phase, a TiCNW composition phase, and the like in the cermet body are phases excluded from the TiCN phase.

In addition, in the case where the interface between the TiCN phase of the cermet body and the hard coating layer is observed in the longitudinal section of the surface-coated TiCN-based cermet cutting tool, regarding an interface length ratio at which the Mo-enriched layer is formed, the adhesion strength is further improved in a case where the Mo-enriched layer is formed at an interface having a length of 60% or more of that of the interface between the TiCN phase of the body and the hard coating layer. Therefore, it is preferable that the interface length ratio of the Mo-enriched layer formed at the interface between the TiCN phase of the cermet body and the hard coating layer be 60% or more. The interface length ratio of the Mo-enriched layer is more preferably 80% or more. Although not particularly limited, the upper limit of the interface length ratio of the Mo-enriched layer may be 95%.

W-Enriched Layer:

In this embodiment, in the cermet body, before the deposition of any of the Ti carbide, the Ti nitride, the Ti carbonitride, the Ti oxycarbide, and the Ti oxycarbonitride as the first layer, Ti etching is performed on the surface of the cermet body to cause W as well as Mo to be unevenly distributed in the TiCN phase of the surface of the cermet body. In addition, by causing W as well as Mo to be unevenly distributed in the TiCN phase of the surface of the cermet body and forming the W-enriched layer, wettability of the cermet body and the hard coating layer is improved, and chemical bonds between the cermet body and the hard coating layer become strong. Therefore, the adhesive strength between the hard coating layer and the cermet body can be further improved.

When the average thickness of the W-enriched layer formed at the interface between the TiCN phase of the cermet body and the hard coating layer is smaller than 0.5 nm, the improvement in the adhesion strength cannot be expected. When the average thickness thereof is greater than 10 nm, cracks propagate in the W-enriched layer and thus the adhesion strength is reduced. Therefore, it is preferable that the average thickness of the W-enriched layer be 0.5 to 10 nm. The average thickness of the W-enriched layer is preferably 2 nm to 8 nm, and more preferably 3 nm to 7 nm.

The W-enriched layer unevenly distributed on the TiCN phase of the surface of the cermet body means a region having a W content of 5 to 50 at % at the interface between the TiCN phase and the hard coating layer.

When the W content of the interface between the TiCN phase and the hard coating layer is less than 5 at %, the W-enriched layer slightly contributes to the improvement in the adhesion strength. When the W content is more than 50 at %, the interface has metallic properties and the effect of strengthening chemical bonds between the cermet body and the hard coating layer is degraded. Therefore, it is preferable that at the interface between the TiCN phase and the hard coating layer, a region which has a W content of 5 to 50 at % and satisfies the average thickness be determined as the W-enriched layer.

The W-enriched layer can be specified in the same method as the method to specify the Mo-enriched layer described above. That is, a region having a W content of 5 to 50 at % is specified through line analysis described above. In addition, a portion having a thickness of 0.5 to 10 nm in the region having a W content of 5 to 50 at % may be determined as the W-enriched layer. Line analysis is performed on five TiCN phases, and the average value of the thicknesses of the five points is determined as the average thickness.

In addition, in the case where the interface between the TiCN phase of the cermet body and the hard coating layer is observed in the longitudinal section of the surface-coated TiCN-based cermet cutting tool, regarding an interface length ratio at which the W-enriched layer is formed, the adhesion strength is further improved in a case where the W-enriched layer is formed at an interface having a length of 60% or more of that of the interface between the TiCN phase of the body and the hard coating layer. Therefore, it is preferable that the interface length ratio of the W-enriched layer formed at the interface between the TiCN phase of the cermet body and the hard coating layer be 60% or more. The interface length ratio of the W-enriched layer is more preferably 80% or more. Although not particularly limited, the upper limit of the interface length ratio of the W-enriched layer may be 95%.

Regarding the interface length ratios of the Mo-enriched layer and the W-enriched layer, during measurement using the transmission electron microscope (TEM) and the energy-dispersive X-ray analyzer described above, compositional mapping is performed in a visual field including the interface between the TiCN phase in the cermet body and the hard coating layer at 500,000×, the length of the interface between the TiCN phase and the hard coating layer is obtained, a region in which the Mo content or the W content is 5 to 50% is drawn as a curve, and the length thereof is obtained. By dividing the length of the region in which the Mo content or the W content is 5 to 50% by the length of the interface, the interface length ratio of the Mo-enriched layer and the interface length ratio of the W-enriched layer formed at the interface between the TiCN phase and the hard coating layer are obtained.

Formation of Mo-Enriched Layer and W-Enriched Layer:

In this embodiment, before the deposition of any of the Ti carbide, the Ti nitride, the Ti carbonitride, the Ti oxycarbide, and the Ti oxycarbonitride as the first layer on the cermet body, for example, Mo and W can be caused to be unevenly distributed in the TiCN phase of the surface of the body by performing Ti etching on the surface of the cermet body under the following condition of first to fourth stages.

First stage TiCl$_4$: 3.0% to 5.0%, H$_2$: remainder, 3 to 7 kPa, 700° C. to 800° C., 5 to 20 minutes Second stage Ar: 100%, 3 to 7 kPa, 700° C. to 800° C.

Third stage TiCl$_4$: 1.0% to 3.0%, H$_2$: remainder, 3 to 7 kPa, 800° C. to 900° C., 5 to 20 minutes Fourth stage Ar: 100%, 3 to 7 kPa, 800° C. to 900° C.

Through the Ti etching, Mo and W contained in the cermet body can be caused to be unevenly distributed in the TiCN phase of the surface of the body.

Next, an example of the surface-coated TiCN-based cermet cutting tool of the present invention will be described in detail.

As an example of the present invention, an example in which any of the Ti carbide, the Ti nitride, the Ti carbonitride, the Ti oxycarbide, and the Ti oxycarbonitride is deposited as the first layer of the hard coating layer on the surface of the cermet body is described. However, in the present invention, further deposition of a well-known hard coating layer such as an Al$_2$O$_3$ layer, a composite nitride layer or a composite oxide layer of Ti and Al, and a composite nitride layer or a composite oxide layer of Cr and Al after forming the first layer, or deposition of a Ti carbide layer, a Ti nitride layer, a Ti carbonitride layer, a Ti oxycarbide layer, and a Ti oxycarbonitride layer as the outermost surface layer of the hard coating layer is not impeded.

EXAMPLES

As raw material powders, a TiCN (TiC/TiN=50/50 in terms of mass ratio) powder, a Mo$_2$C powder, a ZrC powder, a NbC powder, a TaC powder, a WC powder, a Co powder, and a Ni powder, all of which had an average grain size of 0.5 μm to 2 μm, were prepared, and the raw material powders were mixed in mixing compositions shown in Table 1, were subjected to wet mixing by a ball mill for 24 hours, and were dried. Thereafter, the resultant was press-formed into compacts at a pressure of 98 MPa, and the compacts were sintered in a nitrogen atmosphere at 1.3 kPa under the condition that the compacts were held at a temperature of 1540° C. for one hour. After the sintering, a cutting edge portion was subjected to honing to have a radius R of 0.07 mm, thereby forming cermet bodies 1 to 10 having insert shapes according to ISO standard CNMG120412.

In Table 1, as the mixing ratios, at % of Mo and W are also shown.

TABLE 1

| Type | | Co | Ni | Mo$_2$C | (at % of Mo) | WC | (at % of W) | ZrC | TaC | NbC | TiCN |
|---|---|---|---|---|---|---|---|---|---|---|---|
| Cermet | 1 | 12 | 6 | 10 | 4.2 | 15 | 3.3 | — | 7 | — | Remainder |
| body | 2 | 7 | 7 | 7.5 | 3.0 | 15 | 3.1 | — | 5 | — | Remainder |
| | 3 | 8 | 8 | 10 | 3.8 | 5.5 | 1.1 | — | 4 | 5 | Remainder |
| | 4 | 9 | 6 | 6 | 2.4 | 13 | 2.7 | — | 6 | 2 | Remainder |
| | 5 | 8 | 5 | 10 | 4.0 | 10 | 2.1 | 1 | 8 | — | Remainder |
| | 6 | 5 | 5 | 23.5 | 9.8 | 10 | 2.2 | — | 5 | — | Remainder |
| | 7 | 8 | 8 | 2.5 | 1.0 | 20 | 4.3 | 2 | 4 | 3 | Remainder |
| | 8 | 7 | 8 | 5 | 1.9 | 14 | 2.8 | — | — | 7 | Remainder |
| | 9 | 6 | 7 | 10 | 4.0 | 15 | 3.2 | — | 4 | 3 | Remainder |
| | 10 | 9 | 6 | 6 | 3.0 | 38 | 9.9 | 1 | 5 | — | Remainder |

Subsequently, Ti etching was performed on the cermet body under the conditions of the first to fourth stages shown in Table 2 before the formation of the first layer of the hard coating layer on the surfaces of the tool bodies 1 to 10 using a chemical vapor deposition apparatus.

Each of conditions of Condition A to Condition G shown in Table 2 had a first stage, a second stage, a third stage, and a fourth stage in order from the top.

Thereafter, under the conditions shown in Table 3, a Ti compound layer formed of any of a Ti carbide, a Ti nitride, a Ti carbonitride, a Ti oxycarbide, and a Ti oxycarbonitride shown in Table 4 was deposited on the surface of the cermet body as the first layer.

In addition, the types of the hard coating layer of Table 3 are displayed in Tables 4 and 5 as follows. "TiC layer"="TiC", "TiN layer (first layer)"="TiN" shown as the first layer of Tables 4 and 5, "TiN layer (other layers)"="TiN" shown as the second to fourth layers in Tables 4 and 5, "1-TiC$_{0.5}$N$_{0.5}$ layer"="1-TiCN", "TiCN layer"="TiCN", "TiCO layer"="TiCO", "TiCNO layer"="TiCNO", and "Al$_2$O$_3$ layer"="Al$_2$O$_3$".

Next, by further depositing a Ti compound layer shown in Table 4 (formation of second to fourth layers) under the conditions shown in Table 3, surface-coated TiCN-based cermet cutting tools of the present invention (hereinafter, referred to as the present invention coated tools) 1 to 8 and 14 to 16 shown in Table 4 were produced.

In addition, regarding some of those, by depositing an Al$_2$O$_3$ layer (upper layer) shown in Table 4 on the deposited Ti compound layer (lower layer) under the conditions shown in Table 3, the present invention coated tools 9 to 13 shown in Table 4 were produced.

For the purpose of comparison, regarding some of the same tool bodies 1 to 10, Ti etching was performed on the cermet body under the conditions shown in Table 2 before the first layer of the hard coating layer was formed on the surface of the tool body by the chemical vapor deposition apparatus.

Thereafter, on the surface of the cermet body including the tool body which was not subjected to Ti etching, the Ti compound layer formed of any of a Ti carbide, a Ti nitride, a Ti carbonitride, a Ti oxycarbide, and a Ti oxycarbonitride shown in Table 5 was deposited as the first layer under the conditions shown in Table 3.

Next, under the conditions shown in Table 3, the Ti compound layers shown in Table 5 were further deposited (formation of second to fourth layers), thereby producing surface-coated TiCN-based cermet cutting tools of comparative examples (hereinafter, referred to as "comparative example coated tools") 1 to 8 shown in Table 5.

In addition, regarding some of those, an Al$_2$O$_3$ layer (upper layer) shown in Table 5 was deposited on the deposited Ti compound layer (lower layer) under the conditions shown in Table 3, thereby producing comparative example coated tools 9 to 13 shown in Table 5.

Compositional mapping was performed on the present invention coated tools 1 to 16 and the comparative example coated tools 1 to 13 produced above in a visual field at 10,000× using the transmission electron microscope (TEM) and the energy-dispersive X-ray analyzer, a TiCN phase in the cermet body was specified, a line was drawn into a length of 50 nm to be perpendicular to the interface between the TiCN phase and the hard coating layer in a visual field including the interface between the TiCN phase and the hard coating layer at 500,000× so as to intersect the interface between the TiCN phase and the hard coating layer at the center of the line segment, and line analysis including the interface between the TiCN phase and the hard coating layer was performed by performing compositional analysis on the line.

From the results, a region in which the Mo content or the W content was 5 to 50 at % was specified as an enriched layer, and the thickness of the enriched layer was obtained. Moreover, the line analysis was performed on five TiCN phases, and by obtaining averages, the average thicknesses of the Mo-enriched layer and the W-enriched layer, the Mo content of the Mo-enriched layer, and the W content of the W-enriched layer were obtained.

Tables 4 and 5 show the results.

In addition, regarding the interface length ratios of the Mo-enriched layer and the W-enriched layer, during measurement using the transmission electron microscope (TEM) and the energy-dispersive X-ray analyzer, compositional mapping was performed in a visual field including the interface between the TiCN phase in the cermet body and the hard coating layer at 500,000×, the length of the interface between the TiCN phase and the hard coating layer was obtained, a region in which the Mo content or the W content is 5 to 50% was drawn as a curve, and the length thereof was obtained. By dividing the length of the region in which the Mo content or the W content was 5 to 50% by the length of the interface, the interface length ratio of the Mo-enriched layer and the interface length ratio of the W-enriched layer formed at the interface between the TiCN phase and the hard coating layer were obtained.

Tables 4 and 5 show the results.

In addition, the layer thickness of each of the layers constituting the hard coating layers of the present invention coated tools 1 to 16 and the comparative example coated tools 1 to 13 was measured using a scanning electron microscope (the magnification was set to an appropriate value in a range of 5,000× to 200,000×), and the layer thicknesses of five points in an observation visual field were measured and averaged to obtain the average layer thickness.

TABLE 2

| Condition type | Reaction gas composition (vol %) | Pressure (kPa) | Temperature (° C.) | Time (min) |
|---|---|---|---|---|
| Condition A | $TiCl_4$: 4.0%, $H_2$: remainder | 5 | 750 | 10 |
| | Ar: 100% | 5 | 750 | 5 |
| | $TiCl_4$: 2.0%, $H_2$: remainder | 5 | 850 | 10 |
| | Ar: 100% | 5 | 850 | b5 |

TABLE 2-continued

| Condition type | Reaction gas composition (vol %) | Pressure (kPa) | Temperature (° C.) | Time (min) |
|---|---|---|---|---|
| Condition B | $TiCl_4$: 5.0%, $H_2$: remainder | 7 | 700 | 5 |
| | Ar: 100% | 7 | 700 | 5 |
| | $TiCl_4$: 3.0%, $H_2$: remainder | 7 | 800 | 5 |
| | Ar: 100% | 7 | 800 | 5 |
| Condition C | $TiCl_4$: 3.0%, $H_2$: remainder | 3 | 800 | 20 |
| | Ar: 100% | 3 | 800 | 5 |
| | $TiCl_4$: 1.0%, $H_2$: remainder | 3 | 900 | 20 |
| | Ar: 100% | 3 | 900 | 5 |
| Condition D | $TiCl_4$: 5.0%, $H_2$: remainder | 7 | 800 | 20 |
| | Ar: 100% | 7 | 800 | 10 |
| | $TiCl_4$: 3.0%, $H_2$: remainder | 7 | 900 | 20 |
| | Ar: 100% | 7 | 900 | 10 |
| Condition E | $TiCl_4$: 3.0%, $H_2$: remainder | 3 | 700 | 5 |
| | Ar: 100% | 3 | 700 | 3 |
| | $TiCl_4$: 1.0%, $H_2$: remainder | 3 | 800 | 5 |
| | Ar: 100% | 3 | 800 | 3 |
| Condition F | $TiCl_4$: 2.0%, $H_2$: remainder | 2 | 650 | 3 |
| | Ar: 100% | 2 | 650 | 3 |
| | $TiCl_4$: 0.5%, $H_2$: remainder | 2 | 750 | 3 |
| | Ar: 100% | 2 | 750 | 3 |
| Condition G | $TiCl_4$: 6.0%, $H_2$: remainder | 8 | 850 | 30 |
| | Ar: 100% | 8 | 850 | 5 |
| | $TiCl_4$: 4.0%, $H_2$: remainder | 8 | 950 | 30 |
| | Ar: 100% | 8 | 950 | 5 |

TABLE 3

| Hard coating layer | | Forming conditions (pressure of reaction atmosphere is expressed as kPa and temperature is expressed as ° C.) | | |
|---|---|---|---|---|
| Type | Composition (numbers indicate atomic ratios) | Reaction gas composition (vol %) | Reaction atmosphere Pressure | Temperature |
| TiC layer | TiC | $TiCl_4$: 4.2%, $CH_4$: 8.5%, $H_2$: remainder | 7 | 1020 |
| TiN layer (first layer) | TiN | $TiCl_4$: 4.2%, $N_2$: 30%, $H_2$: remainder | 30 | 900 |
| TiN layer (other layers) | TiN | $TiCl_4$: 4.2%, $N_2$: 35%, $H_2$: remainder | 50 | 1040 |
| l-$TiC_{0.5}N_{0.5}$ layer | $TiC_{0.5}N_{0.5}$ | $TiCl_4$: 4.2%, $N_2$: 20%, $CH_3CN$: 0.6%, $H_2$: remainder | 7 | 900 |
| TiCN layer | $TiC_{0.5}N_{0.5}$ | $TiCl_4$: 4.2%, $N_2$: 20%, $CH_4$: 4%, $H_2$: remainder | 12 | 1020 |
| TiCO layer | $TiC_{0.5}O_{0.5}$ | $TiCl_4$: 4.2%, CO: 4%, $H_2$: remainder | 7 | 1020 |
| TiCNO layer | $TiC_{0.3}N_{0.3}O_{0.4}$ | $TiCl_4$: 4.2%, CO: 3%, $CH_4$: 3%, $N_2$: 20%, $H_2$: remainder | 20 | 1020 |
| $Al_2O_3$ layer | $Al_2O_3$ | $AlCl_3$: 3%, $CO_2$: 6%, HCl: 8%, $H_2S$: 0.4%, $H_2$: remainder | 7 | 1000 |

TABLE 4

| | | | | Enriched layer formed at interface between TiCN phase and hard coating layer | | | | | | Hard coating layer Lower layer (Ti compound layer) | |
|---|---|---|---|---|---|---|---|---|---|---|---|
| | | | Ti etching type (see Table 2) | Mo-enriched layer | | | W-enriched layer | | | First layer | |
| Type | | Tool body symbol | | Thickness (nm) | Mo content (at %) | Interface length ratio (%) | Thickness (nm) | W content (at %) | Interface length ratio (%) | Type | Average layer thickness (μm) |
| Present invention coated tool | 1 | 1 | A | 3 | 20 | 90 | 3 | 17 | 85 | TiN | 1 |
| | 2 | 2 | B | 1 | 15 | 64 | 1 | 16 | 64 | TiN | 1 |
| | 3 | 3 | E | 5 | 17 | 81 | 0.3 | 3 | 52 | TiN | 1 |
| | 4 | 4 | A | 7 | 12 | 88 | 7 | 14 | 85 | TiN | 1 |
| | 5 | 5 | B | 6 | 21 | 95 | 9 | 10 | 93 | TiN | 1 |
| | 6 | 6 | D | 10 | 50 | 93 | 2 | 11 | 65 | TiN | 0.5 |
| | 7 | 7 | E | 0.5 | 5 | 60 | 0.5 | 5 | 60 | TiN | 0.5 |
| | 8 | 8 | C | 5 | 9 | 85 | 6 | 14 | 83 | l-TiCN | 1 |
| | 9 | 9 | C | 7 | 19 | 89 | 7 | 18 | 88 | TiN | 0.5 |
| | 10 | 10 | D | 9 | 14 | 94 | 14 | 61 | 92 | TiN | 1.5 |
| | 11 | 1 | D | 6 | 20 | 85 | 10 | 50 | 83 | TiN | 1.5 |
| | 12 | 2 | B | 9 | 16 | 89 | 9 | 15 | 88 | TiN | 1.5 |
| | 13 | 3 | A | 4 | 18 | 91 | 3 | 6 | 86 | l-TiCN | 7 |
| | 14 | 8 | F | 1 | 12 | 55 | 2 | 7 | 63 | TiN | 1 |

TABLE 4-continued

| | | | | | | | | | | | |
|---|---|---|---|---|---|---|---|---|---|---|---|
| 15 | 5 | F | 4 | 18 | 91 | 0.3 | 4 | 63 | TiN | 0.5 | |
| 16 | 6 | F | 4 | 18 | 91 | 0.6 | 6 | 57 | TiN | 1.5 | |

| | | Hard coating layer | | | | | | |
|---|---|---|---|---|---|---|---|---|
| | | Lower layer (Ti compound layer) | | | | | | |
| | | Second layer | Third layer | | Fourth layer | | Total | |
| | Type | Type | Average layer thickness (μm) | Type | Average layer thickness (μm) | Type | Average layer thickness (μm) | average layer thickness (μm) | Average layer thickness of upper layer (Al$_2$O$_3$) (μm) |
| Present invention coated tool | 1 | 1-TiCN | 12 | TiN | 1 | — | — | 14 | — |
| | 2 | 1-TiCN | 7 | TiN | 1.5 | — | — | 9.5 | — |
| | 3 | 1-TiCN | 4 | TiC | 2 | — | — | 7 | — |
| | 4 | 1-TiCN | 9 | — | — | — | — | 10 | — |
| | 5 | 1-TiCN | 6 | TiN | 0.5 | — | — | 7.5 | — |
| | 6 | 1-TiCN | 2 | TiC | 0.3 | — | — | 2.8 | — |
| | 7 | 1-TiCN | 10 | TiC | 1.5 | — | — | 12 | — |
| | 8 | TiCN | 15 | TiN | 0.5 | — | — | 16.5 | — |
| | 9 | 1-TiCN | 8 | TiCO | 0.5 | TiCNO | 0.5 | 9.5 | 7 |
| | 10 | TiC | 1 | TiCN | 8 | TiCO | 1 | 11.5 | 15 |
| | 11 | TiC | 1 | 1-TiCN | 6 | TiCNO | 0.5 | 9 | 10 |
| | 12 | 1-TiCN | 4 | TiCNO | 1.5 | — | — | 7 | 12 |
| | 13 | TiCO | 1 | — | — | — | — | 8 | 7 |
| | 14 | 1-TiCN | 5 | TiN | 1.5 | — | — | 7.5 | — |
| | 15 | 1-TiCN | 10 | TiN | 1 | — | — | 11.5 | — |
| | 16 | 1-TiCN | 7 | TiN | 1 | — | — | 9.5 | — |

TABLE 5

| | | | Enriched layer formed at interface between TiCN phase and hard coating layer | | | | | | Hard coating layer Lower layer (Ti compound layer) | |
|---|---|---|---|---|---|---|---|---|---|---|---|
| | | | Ti | Mo-enriched layer | | | W-enriched layer | | | First layer | |
| Type | | Tool body symbol | etching type (see Table 2) | Thickness (nm) | Mo content (at %) | Interface length ratio (%) | Thickness (nm) | W content (at %) | Interface length ratio (%) | Type | Average layer thickness (μm) |
| Comparative example coated tool | 1 | 1 | — | — | — | — | — | — | — | TiN | 1 |
| | 2 | 2 | — | — | — | — | — | — | — | TiN | 1 |
| | 3 | 3 | — | — | — | — | — | — | — | TiN | 1 |
| | 4 | 4 | — | — | — | — | — | — | — | TiN | 1 |
| | 5 | 5 | — | — | — | — | — | — | — | TiN | 1 |
| | 6 | 6 | G | 15 | 55 | 92 | 10 | 41 | 87 | TiN | 0.5 |
| | 7 | 7 | F | 0.3 | 3 | 65 | 0.5 | 5 | 53 | TiN | 0.5 |
| | 8 | 8 | — | — | — | — | — | — | — | 1-TiCN | 1 |
| | 9 | 9 | — | — | — | — | — | — | — | TiN | 0.5 |
| | 10 | 10 | — | — | — | — | — | — | — | TiN | 1.5 |
| | 11 | 1 | — | — | — | — | — | — | — | TiN | 1.5 |
| | 12 | 2 | — | — | — | — | — | — | — | TiN | 1.5 |
| | 13 | 3 | — | — | — | — | — | — | — | 1-TiCN | 7 |

| | | Hard coating layer | | | | | | |
|---|---|---|---|---|---|---|---|---|
| | | Lower layer (Ti compound layer) | | | | | | |
| | | Second layer | Third layer | | Fourth layer | | Total | |
| | Type | Type | Average layer thickness (μm) | Type | Average layer thickness (μm) | Type | Average layer thickness (μm) | average layer thickness (μm) | Average layer thickness of upper layer (Al$_2$O$_3$) (μm) |
| Comparative example coated tool | 1 | 1-TiCN | 12 | TiN | 1 | — | — | 14 | — |
| | 2 | 1-TiCN | 7 | TiN | 1.5 | — | — | 9.5 | — |
| | 3 | 1-TiCN | 4 | TiC | 2 | — | — | 7 | — |
| | 4 | 1-TiCN | 9 | — | — | — | — | 10 | — |
| | 5 | 1-TiCN | 6 | TiN | 0.5 | — | — | 7.5 | — |

TABLE 5-continued

|   | | | | | | | | |
|---|---|---|---|---|---|---|---|---|
| 6 | 1-TiCN | 2 | TiC | 0.3 | — | — | 2.8 | — |
| 7 | 1-TiCN | 10 | TiC | 1.5 | — | — | 12 | — |
| 8 | TiCN | 15 | TiN | 0.5 | — | — | 16.5 | — |
| 9 | 1-TiCN | 8 | TiCO | 0.5 | TiCNO | 0.5 | 9.5 | 7 |
| 10 | TiC | 1 | TiCN | 8 | TiCO | 1 | 11.5 | 15 |
| 11 | TiC | 1 | 1-TiCN | 6 | TiCNO | 0.5 | 9 | 10 |
| 12 | 1-TiCN | 4 | TiCNO | 1.5 | — | — | 7 | 12 |
| 13 | TiCO | 1 | — | — | — | — | 8 | 7 |

Next, in a state in which each of the various coated tools was screwed to a tip end portion of an insert holder made of tool steel by a fixing tool, regarding the present invention coated tools 1 to 16 and the comparative example coated tools 1 to 13, a wet high-speed intermittent cutting test for ductile cast iron (a typical cutting speed was 200 m/min) was conducted under conditions (cutting conditions A) including:

Work material: a round bar with four longitudinal grooves formed at equal intervals in the longitudinal direction of JIS-FCD 700-2 (ISO 1083/700-2)
Cutting speed: 350 m/min
Depth of cut: 1.4 mm
Feed rate: 0.3 mm/rev
Cutting oil agent: present
Cutting time: 6 minutes, and a dry high-speed intermittent cutting test for alloy steel (a typical cutting speed was 300 m/min) was conducted under conditions (cutting conditions B) including:

Work material: a round bar with four longitudinal grooves formed at equal intervals in the longitudinal direction of JIS SCM440
Cutting speed: 410 m/min
Depth of cut: 2.0 mm
Feed rate: 0.3 mm/rev
Cutting time: 6 minutes.

In both the cutting tests, the flank wear width of a cutting edge was measured.

The measurement results are shown in Table 6.

From the results shown in Tables 4 and 6, it is apparent that regarding the present invention coated tools 1 to 16, in the surface-coated TiCN-based cermet cutting tools in which any of the Ti carbide, the Ti nitride, the Ti carbonitride, the Ti oxycarbide, and the Ti oxycarbonitride as the first layer is deposited as the hard coating layer, the Mo-enriched layer and the W-enriched layer having predetermined thicknesses, predetermined amounts, and predetermined interface lengths are formed at the interface between the TiCN phase of the body and the hard coating layer, and accordingly, chemical bonds between the cermet body and the hard coating layer become strong via W and Mo unevenly distributed at the interface. Therefore, the hard coating layer as a coating has excellent adhesive strength to the cermet body, and exhibits excellent chipping resistance and wear resistance during long-term use even in a case of being used for high-speed intermittent cutting work of cast iron, alloy steel, or the like in which a high load is exerted on a cutting edge.

That is, regarding the present invention coated tools 1 to 16, under any of the cutting conditions A and the cutting conditions B, abnormal damage such as chipping, defects, and peeling did not occur in the hard coating layer within a cutting time (6 minutes) and a service life was not reached. Therefore, after the cutting tests, wear, that is, the "flank wear width (mm)" of the hard coating layer of the coated tool was measured.

In addition, regarding the present invention coated tools 1 to 16, when the present invention coated tool 3 in which the thickness and the interface length ratio of the W-enriched

TABLE 6

| Type | | Flank wear width (mm) | | Type | | Cutting test results (min) | |
|---|---|---|---|---|---|---|---|
| | | Cutting conditions (A) | Cutting conditions (B) | | | Cutting conditions (A) | Cutting conditions (B) |
| Present invention coated tool | 1 | 0.12 | 0.13 | Comparative example coated tool | 1 | 2.8 | 2.9 |
| | 2 | 0.15 | 0.14 | | 2 | 2.3 | 2.5 |
| | 3 | 0.27 | 0.26 | | 3 | 1.2 | 1.2 |
| | 4 | 0.17 | 0.17 | | 4 | 2.5 | 2.6 |
| | 5 | 0.18 | 0.17 | | 5 | 1.5 | 1.4 |
| | 6 | 0.24 | 0.24 | | 6 | 3.5 | 3.7 |
| | 7 | 0.26 | 0.25 | | 7 | 3.3 | 3.5 |
| | 8 | 0.19 | 0.18 | | 8 | 2.0 | 2.1 |
| | 9 | 0.17 | 0.16 | | 9 | 2.2 | 2.3 |
| | 10 | 0.26 | 0.26 | | 10 | 2.1 | 2.2 |
| | 11 | 0.23 | 0.22 | | 11 | 2.7 | 2.8 |
| | 12 | 0.18 | 0.18 | | 12 | 2.8 | 3.0 |
| | 13 | 0.11 | 0.11 | | 13 | 2.6 | 2.7 |
| | 14 | 0.28 | 0.28 | | | | |
| | 15 | 0.26 | 0.26 | | | | |
| | 16 | 0.26 | 0.26 | | | | |

(In the table, the cutting test results of the Comparative example coated tools indicate cutting time (min) until the service life was reached due to fine chipping, defects, peeling, or the like generated in the hard coating layer.)

layer did not satisfy the preferable ranges of the present invention and the present invention coated tool 1 in which the thickness and the interface length ratio of the W-enriched layer satisfied the preferable ranges of the present invention were compared to each other, the present invention coated tool 1 had a smaller flank wear width and had a tendency toward a further improvement in adhesion strength.

When the present invention coated tool 14 in which the interface length ratio of the Mo-enriched layer did not satisfy the preferable range of the present invention and the present invention coated tool 8 in which the interface length ratio of the Mo-enriched layer satisfied the preferable range of the present invention were compared to each other, the present invention coated tool 8 had a smaller flank wear width and had a tendency toward a further improvement in adhesion strength.

When the present invention coated tool 15 in which the thickness of the W-enriched layer did not satisfy the preferable range of the present invention and the present invention coated tool 5 in which the thickness of the W-enriched layer satisfied the preferable range of the present invention were compared to each other, the present invention coated tool 5 had a smaller flank wear width and had a tendency toward a further improvement in adhesion strength.

When the present invention coated tool 16 in which the interface length ratio of the W-enriched layer did not satisfy the preferable range of the present invention and the present invention coated tool 6 in which the interface length ratio of the W-enriched layer satisfied the preferable range of the present invention were compared to each other, the present invention coated tool 6 had a smaller flank wear width and had a tendency toward a further improvement in adhesion strength.

Contrary to this, from the results shown in Tables 5 and 6, it is apparent that regarding each of the comparative example coated tools 1 to 13, since the Mo-enriched layer and the W-enriched layer having predetermined thicknesses, predetermined amounts, and predetermined interface lengths were not formed at the interface between the TiCN phase of the body and the hard coating layer, during high-speed intermittent cutting work of cast iron, alloy steel, or the like in which a high load was exerted on a cutting edge, abnormal damage such as chipping, defects, and peeling occurred and a service life was reached within a relatively short period of time.

That is, regarding the comparative example coated tools 1 to 13, under any of the cutting conditions A and the cutting conditions B, abnormal damage such as chipping, defects, and peeling occurred in the hard coating layer within a cutting time (6 minutes) and a service life was reached. Accordingly, the "flank wear width (mm)" of the cutting edge was not measured. Therefore, the service lives of the comparative example coated tools 1 to 13 are shown as "cutting test results (minutes)" in Table 6.

For example, even when the Mo-enriched layer and the W-enriched layer were formed, in the comparative example coated tool 6 in which the thickness of the Mo-enriched layer was greater than the range of the present invention, cracks were observed in the Mo-enriched layer, peeling occurred early, and the service life was reached such that the adhesion strength was degraded. In addition, even when the Mo-enriched layer and the W-enriched layer were formed, in the comparative example coated tool 7 in which the thickness of the Mo-enriched layer was smaller than the range of the present invention, similarly, peeling occurred early, and the service life was reached such that the adhesion strength was degraded.

INDUSTRIAL APPLICABILITY

As described above, the coated tool of the present invention exhibits excellent cutting performance in a case where cast iron or the like is provided for high-speed intermittent cutting work in which high-temperature heat is generated, and can be used as coated tools for various work materials. Furthermore, excellent wear resistance is exhibited during long-term use, and thus the coated tool can satisfactorily achieve enhancement in the performance of a cutting apparatus, power saving and energy saving during cutting work, and a further reduction in cost.

The invention claimed is:

1. A surface-coated TiCN-based cermet cutting tool, comprising:
   a body made of a TiCN-based cermet containing a TiCN phase as a hard phase component and containing 1 to 10 at % of each of W and Mo; and
   a hard coating layer which is a first layer deposited on a surface of the body made of the TiCN-based cermet and is formed of any of a Ti carbide, a Ti nitride, a Ti carbonitride, a Ti oxycarbide, and a Ti oxycarbonitride,
   wherein a Mo-enriched layer having an average thickness of 0.5 to 10 nm is formed at an interface between the TiCN phase of the body and the hard coating layer.

2. The surface-coated TiCN-based cermet cutting tool according to claim 1,
   wherein, in a case where the interface between the TiCN phase of the body and the hard coating layer is observed in a longitudinal section of the surface-coated TiCN-based cermet cutting tool, the Mo-enriched layer is formed at an interface having a length of 60% or more of that of the interface between the TiCN phase of the body and the hard coating layer.

3. The surface-coated TiCN-based cermet cutting tool according to claim 1,
   wherein, in addition to the Mo-enriched layer, a W-enriched layer having an average thickness of 0.5 to 10 nm is formed at the interface between the TiCN phase of the body and the hard coating layer.

4. The surface-coated TiCN-based cermet cutting tool according to claim 3,
   wherein, in a case where the interface between the TiCN phase of the body and the hard coating layer is observed in the longitudinal section of the surface-coated TiCN-based cermet cutting tool, the W-enriched layer is formed at an interface having a length of 60% or more of that of the interface between the TiCN phase of the body and the hard coating layer.

5. The surface-coated TiCN-based cermet cutting tool according to claim 2,
   wherein, in addition to the Mo-enriched layer, a W-enriched layer having an average thickness of 0.5 to 10 nm is formed at the interface between the TiCN phase of the body and the hard coating layer.

6. The surface-coated TiCN-based cermet cutting tool according to claim 5,
   wherein, in a case where the interface between the TiCN phase of the body and the hard coating layer is observed in the longitudinal section of the surface-coated TiCN-based cermet cutting tool, the W-enriched layer is formed at an interface having a length of 60% or more of that of the interface between the TiCN phase of the body and the hard coating layer.

* * * * *